United States Patent
Dunn et al.

(10) Patent No.: US 8,649,153 B2
(45) Date of Patent: Feb. 11, 2014

(54) TAPERED VIA AND MIM CAPACITOR

(75) Inventors: James Stuart Dunn, Jericho, VT (US); Zhong-Xiang He, Essex Junction, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 13/096,850

(22) Filed: Apr. 28, 2011

(65) Prior Publication Data

US 2012/0275080 A1    Nov. 1, 2012

(51) Int. Cl.
*H01G 4/30* (2006.01)
(52) U.S. Cl.
USPC ....................................... 361/301.4
(58) Field of Classification Search
USPC ............... 361/301.4, 301.2, 311–313, 303; 257/295, 296, 306, 308–309
See application file for complete search history.

(56) References Cited

U.S. PATENT DOCUMENTS

| | | | |
|---|---|---|---|
| 5,926,359 A | 7/1999 | Greco | |
| 6,051,859 A * | 4/2000 | Hosotani et al. | 257/306 |
| 6,165,864 A | 12/2000 | Shen | |
| 6,249,016 B1 | 6/2001 | Chaudhry | |
| 6,822,283 B2 | 11/2004 | Lin | |
| 6,864,137 B2 * | 3/2005 | Yoshitomi et al. | 438/240 |
| 6,900,141 B2 | 5/2005 | Watanabe | |
| 7,371,635 B2 * | 5/2008 | Takaya | 438/239 |
| 2010/0129978 A1 * | 5/2010 | Kim | 438/393 |

* cited by examiner

*Primary Examiner* — Nguyen T Ha
(74) *Attorney, Agent, or Firm* — Louis J. Percello; Robert M. Trepp

(57) ABSTRACT

A chip capacitor and interconnecting wiring is described incorporating a metal insulator metal (MIM) capacitor, tapered vias and vias coupled to one or both of the top and bottom electrodes of the capacitor in an integrated circuit. A design structure tangibly embodied in a machine readable medium is described incorporating computer readable code defining a MIM capacitor, tapered vias, vias and wiring levels in an integrated circuit.

6 Claims, 5 Drawing Sheets

TAPERED VIA AND MIM CAPACITOR

BACKGROUND

The present invention relates to a chip capacitor and wiring in an integrated circuit and to a machine readable medium embodying a design structure and, more specifically, to a metal insulator metal capacitor and interconnecting wiring containing vias connecting to other wiring levels.

The top and bottom electrodes of a metal insulator metal (MIM) parallel plate capacitor may be contacted using vias from the top and bottom electrodes to the wiring layer above the capacitor which is cumbersome and results in excessive radio frequency (rf) coupling noise.

BRIEF SUMMARY OF THE INVENTION

In accordance with the present invention, an apparatus is described comprising an insulating substrate having an upper surface; a first metal wiring lead in said insulating substrate; a bottom electrode of a parallel plate capacitor in the insulating substrate; a first insulating layer over the insulating substrate containing a first opening to the first metal wiring lead and a second opening to the bottom electrode; the second opening interior of a periphery of the bottom electrode; a second insulating layer over the bottom electrode and on sidewalls of the second opening; and a top electrode of the parallel plate capacitor over the second insulating layer in the second opening and having a portion forming a second metal wiring lead, the second metal wiring lead passing over an upper surface of one or both of the first insulating layer and the second insulating layer and into the first opening to the first metal wiring lead.

The present invention further describes a method comprising selecting an insulating substrate having an upper surface; forming a first metal wiring lead in the insulating substrate; forming a bottom electrode of a parallel plate capacitor in the insulating substrate; forming a first insulating layer over the insulating substrate containing a first opening to the first metal wiring lead and a second opening to the bottom electrode; the second opening interior of a periphery of the bottom electrode; forming a second insulating layer over the bottom electrode and on sidewalls of the second opening; and forming a top electrode of the parallel plate capacitor over the second insulating layer in the second opening and having a portion forming a second metal wiring lead; the second metal wiring lead passing over an upper surface of one or both of the first insulating layer and the second insulating layer and into the first opening to the first metal wiring lead.

The present invention further describes an apparatus comprising an insulating substrate having an upper surface and having a first wire embedded in the insulating substrate; a first insulating layer over the upper surface of the insulating substrate and over the first wire; a first tapered opening in the first insulating layer over the first wire exposing the upper surface of the first wire; a bottom electrode of a capacitor on the first insulating layer; a first conductor over the upper surface of the first wire, the first tapered opening and the first insulating layer to a bottom electrode; a second insulating layer over the bottom electrode; and a top electrode of the capacitor on the second insulating layer positioned over the bottom electrode; the top electrode having a periphery interior of a periphery the bottom electrode.

The present invention further describes a method comprising selecting an insulating substrate having an upper surface and having a first wire in the insulating substrate; forming a first insulating layer over the upper surface of the insulating substrate and over the first wire; forming a first tapered opening in the first insulating layer over the first wire exposing the upper surface of the first wire; forming a bottom electrode of a capacitor on said first insulating layer; forming a first conductor over the upper surface of the first wire, the first tapered opening and the first insulating layer to the bottom electrode; forming a second insulating layer over the bottom electrode; and forming a top electrode of the capacitor on the second insulating layer positioned over the bottom electrode; the top electrode having a periphery interior of a periphery of the bottom electrode.

The present invention further describes an apparatus comprising an insulating substrate having an upper surface and having a first wire in the substrate; a first insulating layer over the upper surface of the insulating substrate and over the first wire; a first tapered opening in the first insulating layer over the first wire exposing an upper surface of the first wire; a first conductor over the first tapered opening, and in the upper surface of the first insulating layer to a bottom electrode of a capacitor, the bottom electrode in the first insulating layer, a second insulating layer over the bottom electrode; a top electrode of the capacitor on the second insulating layer positioned above the bottom electrode, the top electrode having a periphery interior of the bottom electrode; a third insulating layer over the second insulating layer and the top electrode; a second wire in the third insulating layer positioned over the top electrode; and a plurality of vias formed in the third insulating layer extending from the second wire to the top electrode of the capacitor.

The present invention further describes a design structure tangibly embodied in a machine readable medium for designing, manufacturing, or testing an integrated circuit, the design structure comprising computer readable code defining an insulating substrate having an upper surface; a first metal wiring lead in the insulating substrate; a bottom electrode of a parallel plate capacitor in the insulating substrate; a first insulating layer over the first insulating substrate containing a first opening to the first metal wiring lead and a second opening to the bottom electrode; the second opening interior of a periphery of the bottom electrode; a second insulating layer over the bottom electrode and on sidewalls of the second opening; and a top electrode of the parallel plate capacitor over the second insulating layer in said second opening and having a portion forming a second metal wiring lead; the second metal wiring lead passing over the upper surface of one or both of the first insulating layer and the second insulating layer and into the first opening to the first metal wiring lead via.

The present invention further describes a design structure tangibly embodied in a machine readable medium for designing, manufacturing, or testing an integrated circuit, the design structure comprising computer readable code defining an insulating substrate having an upper surface and having a first wire embedded in the substrate; a first insulating layer over the upper surface of the insulating substrate and over the first wire; a first tapered opening in the first insulating layer over the first wire exposing the upper surface of the first wire; a bottom electrode of a capacitor on the first insulating layer; a first conductor over the upper surface of the first wire, the first tapered opening, and the first insulating layer to the bottom electrode; a second insulating layer over the bottom electrode; and a top electrode of the capacitor on the second insulating layer positioned over the bottom electrode, the top electrode having a periphery interior of a periphery of the bottom electrode.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which.

DETAILED DESCRIPTION

Figure 1:
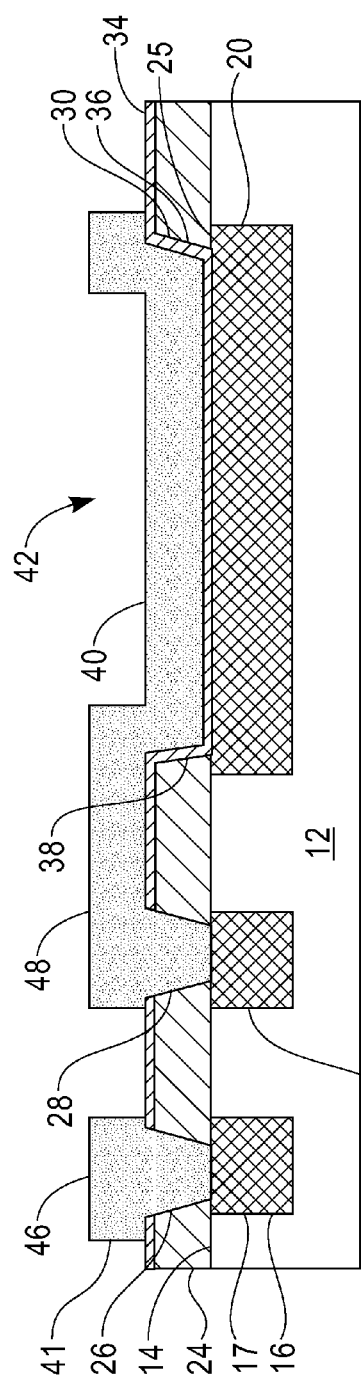
FIG. 1 is a cross-section view of one embodiment of the invention

Referring now to the drawing, FIG. 1 shows a cross-section view of one embodiment of the invention. In this embodiment, both metal bottom electrode 20 and metal top electrode 40 of capacitor 42 are also used to form respective independent wiring levels 17 and 41. Metal top electrode 40 of capacitor 42 is connected using a tapered via to wiring lead 18 in independent wiring level 17. An independent wiring level is a metal interconnection wiring layer that contains a plurality of or many interconnection wires defined by photolithography where individual wires may be connected to interconnection wires in other metal interconnection wiring layers (independent wiring levels) using tapered vias or vertical vias. In FIG. 1, an insulating substrate 12 has an upper surface 14 and contains first metal wiring leads 16 and 18, and metal bottom electrode 20 of parallel plate capacitor 42. Insulating substrate 12 may be an insulator such as silicon oxide, SiCOH, porous SiCOH, sapphire or be a conductor or semiconductor, such as metal, silicon or silicon-on-insulator (SOI) having an insulating region or regions thereon such as an insulating layer, for example, an oxide layer. First metal wiring leads 16 and 18, and bottom electrode 20 form independent wiring level 17. Bottom electrode 20 may have the same thickness as first metal wiring leads 16 and 18 and may be formed at the same time as first metal wiring leads 16 and 18 are formed. As shown in FIG. 1, first metal wiring leads 16 and 18 and metal bottom electrode 20 are coplanar with upper surface 14. Metal wiring leads 16, 18, and metal bottom electrode 20 may be formed using a damascene copper process, where trenches are etched into upper surface 14 of insulating substrate 12; a thin refractory metal liner such as TaN/Ta (not shown), is deposited; a thin Cu seed layer is deposited, a thick Cu layer to fill the trenches is electroplated, and chemical mechanical polishing (CMP) is used to remove excess liner and copper away from upper surface 14 of insulating substrate 12, as known in the art. Alternatively, metal wiring leads 16, 18, and metal bottom electrode 20 may be formed on an underlying substrate using a subtractive-etch process of any metal or metals followed by an insulator deposition and planarization process to form an insulating substrate on the underlying substrate which in combination form insulating substrate 12, as known in the art. Metal wiring leads 16, 18, and metal bottom electrode 20 may have a thickness ranging from 0.1 to 10 μm, and more typically ranging from 0.2 to 2 μm.

A second insulating layer 24 is formed over upper surface 14 of first insulating layer 12, metal wiring leads 16, 18, and metal bottom electrode 20. Second insulating layer 24 may comprise silicon oxide, SiCOH, porous SiCOH, or combinations thereof and have a thickness in the range from 0.5 μm to 5 μm. If metal wiring leads 16, 18, and metal bottom electrode 20 were formed using a damascene copper process, then a copper diffusion barrier (not shown in FIG. 1) would be needed to cap the copper, such as chemical vapor deposition (CVD) of a layer of silicon nitride or electroplated CoWP, as known in the art. Second insulating layer 24 contains first tapered openings 26 and 28 passing through second insulating layer 24 to the upper surface of first metal wiring leads 16 and 18. A second opening 30 is formed in second insulating layer 24 to upper surface 25 of metal bottom electrode 20. Second opening 30 is formed interior of the periphery of upper surface 25 of metal bottom electrode 20. Openings 26 and 28 in second insulator layer 24 can be referred to as tapered vias, since a subsequent metal deposition and patterning will connect together respective wiring leads of independent wiring levels 17 to independent wiring level 41. Openings 26, 28, and 30 are shown as tapered, or with a non-regressive, greater than 90 degrees, or a non-vertical angle of a via sidewall with respect to the opening bottom which is parallel to upper surface 14. Tapered openings eases the metal fill requirements to fill tapered vias. Other vias may have vertical or regressive sidewalls, an angle of 90 degrees or less than 90 degrees of a via sidewall with respect to the opening bottom which is parallel to upper surface 14.

A third insulating layer 34 is formed over insulating layer 24, metal bottom electrode 20 and on sidewalls 36 and 38 of second opening 30 and functions as a dielectric for capacitor 42. Third insulating layer 34 may have a thickness in the range from 10 nm to 150 nm and may comprise silicon oxide, silicon nitride, alumina, tantalum pentaoxide, or combinations thereof; or any dielectric used to form capacitors, as known in the art.

A metal top electrode 40 of parallel plate capacitor 42 is formed over third insulating layer 34 in opening 30. Second metal wiring leads 46 and 48 are formed over third insulating layer 34 or second insulating layer 24 if third insulating layer 34 is missing or removed and metal fills in openings 26 and 28, respectively to form tapered vias. Second wiring metal lead 46 makes electrical contact to first metal wiring lead 16. Second wiring metal lead 48 makes electrical contact to first metal wiring lead 18 and passes over the upper surface of one or both of second insulating layer 24 and third insulating layer 34 to top electrode 40. Top metal electrode 40 and second metal wiring leads 46 and 48 may have a thickness ranging from 0.1 to 10 μm, more typically ranging from 0.2 to 2 μm, forms an independent wiring level 41 and can be formed using any method, such as by subtractive-etch, where the metal is deposited, patterned, and etched, as known in the art. Alternatively, top metal electrode 40 and second metal wiring leads 46, and 48 could be formed using a lift-off method, where photoresist is patterned, metal is deposited, and the photoresist is removed, as known in the art. Although the metal wiring leads 16 and 18 bottom electrode 20, top electrode 40 and second wiring leads 46, and 48 are shown in isolation, it is envisioned that there may be a plurality of or many interconnection wires where respective wires would connect to additional wiring levels (not shown) using vias and to devices (not shown) i.e. NMOS and PMOS transistors, CMOS, n or p bipolar transistors, diodes, inductors and other capacitors etc. (not shown) using vias to form a passive or active integrated circuit chip, as known in the art. The above description applies to all embodiments discussed below and shown in FIGS. 2-5. In FIGS. 2-5, like references are used for functions or apparatus corresponding to the same functions or apparatus in an earlier figure.

Figure 2:
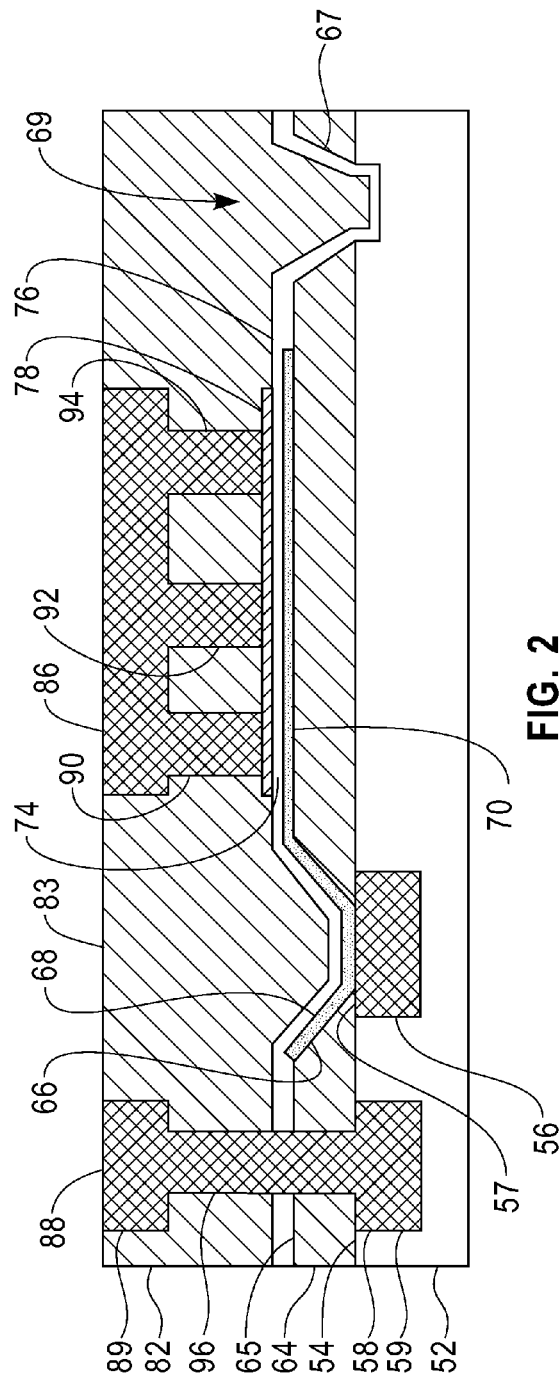
FIG. 2 is a cross-section view of a second embodiment of the invention.

FIG. 2 shows a cross section view of another embodiment of the invention. In this embodiment, neither the lower capacitor plate or upper capacitor plate conductors are used to form independent wiring levels. The lower capacitor plate conductor is directly connected using a tapered via to an independent wiring level below the capacitor and the upper capacitor plate conductor is connected using a via to an independent wiring level above capacitor 74. In FIG. 2, an insulating substrate 52 having an upper surface 54 is shown. Insulating substrate 52 contains first and second spaced apart metal leads 56 and 58 and may have a thickness in the range from 0.1 to 10 µm, more typically in the range from 0.2 to 2 µm, and forms independent wiring level 59 and may be formed using methods similar to those described for metal wiring leads 16 and 18 in FIG. 1. A first insulating layer 64 is formed on upper surface 54 of insulating substrate 52 and over first and second metal leads 56 and 58. A first tapered opening 66 is formed in first insulating layer 64 over first metal lead 56 exposing the upper surface 57 of first lead 56. A second optional tapered opening 67 may be formed in first insulating layer 64 and into insulating substrate 52 to provide a MIM capacitor alignment mark 69. Alignment mark 69 would be used to photolithographically align through a subsequent opaque metal layer used to form a MIM capacitor plate. Alternative methods to align the subsequent MIM capacitor plate level include etching the insulator layer 52 after forming metal leads 56 and 58, to form topography on the wafer. A first conductor 68 is formed over tapered opening 66, upper surface 57 of first lead 56 and over upper surface 65 of first insulating layer 64 to electrically connect to bottom electrode 70.

Bottom electrode 70 is formed on upper surface 65 of first insulating layer 64 and forms the bottom electrode of capacitor 74. First conductor 68 and bottom electrode 70 may be formed by blanket deposition of a metal and patterned by etching using a mask. First conductor 68 and bottom electrode 70 may have a thickness in the range from 0.1 to 5 µm and preferably about 0.5 µm and may comprise W, TiN, TiN/AlCu/TiN, Ta, TaN/Ta, and the like and preferably comprise a 30 nm layer of TiN, a 440 nm layer of AlCu and a 30 nm layer of TiN there over. The optional AlCu film in first conductor 68 reduces the sheet resistance, which improves the quality factor or Q of MIM capacitor 74. The Q of a capacitor is the ratio of its ability to store energy to the sum total of all energy losses within the capacitor. Q may be expressed as the capacitive reactance of the capacitor divided by the sum of resistances in ohms associated with the energy losses in the capacitor. Thus a low ohmic resistance for the top and bottom electrode is needed to obtain a high Q. A second insulating layer 76 is formed over bottom electrode 70 and may have a thickness in the range from 10 nm to 150 nm and preferably about 30 nm comprising silicon nitride or similar film, as described above for insulating layer 34 in FIG. 1. A top electrode 78 of capacitor 74 is formed on second insulating layer 76 positioned over bottom electrode 70 such as by blanket deposition and patterning by etching using a mask. Top electrode 78 may have a periphery interior of bottom electrode 70 and may have a thickness in the range from 0.1 to 5 µm and preferably about 0.5 µm and may comprise W, TiN, TiN/AlCu/TiN, Ta, TaN/Ta, and the like and preferably comprise a 30 nm layer of TiN, a 440 nm layer of AlCu and a 30 nm layer of TiN there over.

A third insulating layer 82 is formed over first insulating layer 64, first conductor 68, top electrode 78 and opening 67. Third insulating layer 82 may comprise a dielectric selected from the group consisting of silicon dioxide, SiCOH and porous-SiCOH and may have a thickness in the range from 0.5 µm to 5 µm and preferably about 2 µm.

A third lead 86 and a fourth lead 88 is formed in upper surface 83 of third insulating layer 82 such as by a dual damascene copper process, as known in the art. During the dual damascene process, it is critically important that openings for vias 90, 92, and 94 are not etched through top electrode 78, which would cause catastrophic shorting of MIM capacitor 74 through the MIM capacitor dielectric i.e. insulating layer 76. Upper surfaces 54, 65 and 83 may be chemically mechanically polished (CMP) to be planar, as described above for metal wiring leads 16 and 18, and metal bottom electrode 20 in FIG. 1. Third lead 86 and fourth lead 88 may have a thickness in the range from 0.1 to 10 µm, more typically in the range from 0.2 to 2 µm, forms independent wiring level 89 and may comprise copper. Third lead 86 has portions positioned over top electrode 78 of capacitor 74. Vias 90, 92 and 94 are formed between third lead 86 and top electrode 78 such as by a dual damascene process and may comprise copper to form a low resistance interconnection as well as a low inductance interconnection by the use of vias 90, 92 and 94. Fourth lead 88 may have portions positioned over second lead 58. Via 96 is formed between fourth lead 88 and first lead 58 passing through third insulating layer 82, insulating layer 76 and first insulating layer 64 such as by a dual damascene copper process and may comprise copper to form a low resistance interconnection. In a dual damascene copper process, the leads are formed and then the vias are formed or vice versa.

Figure 3:
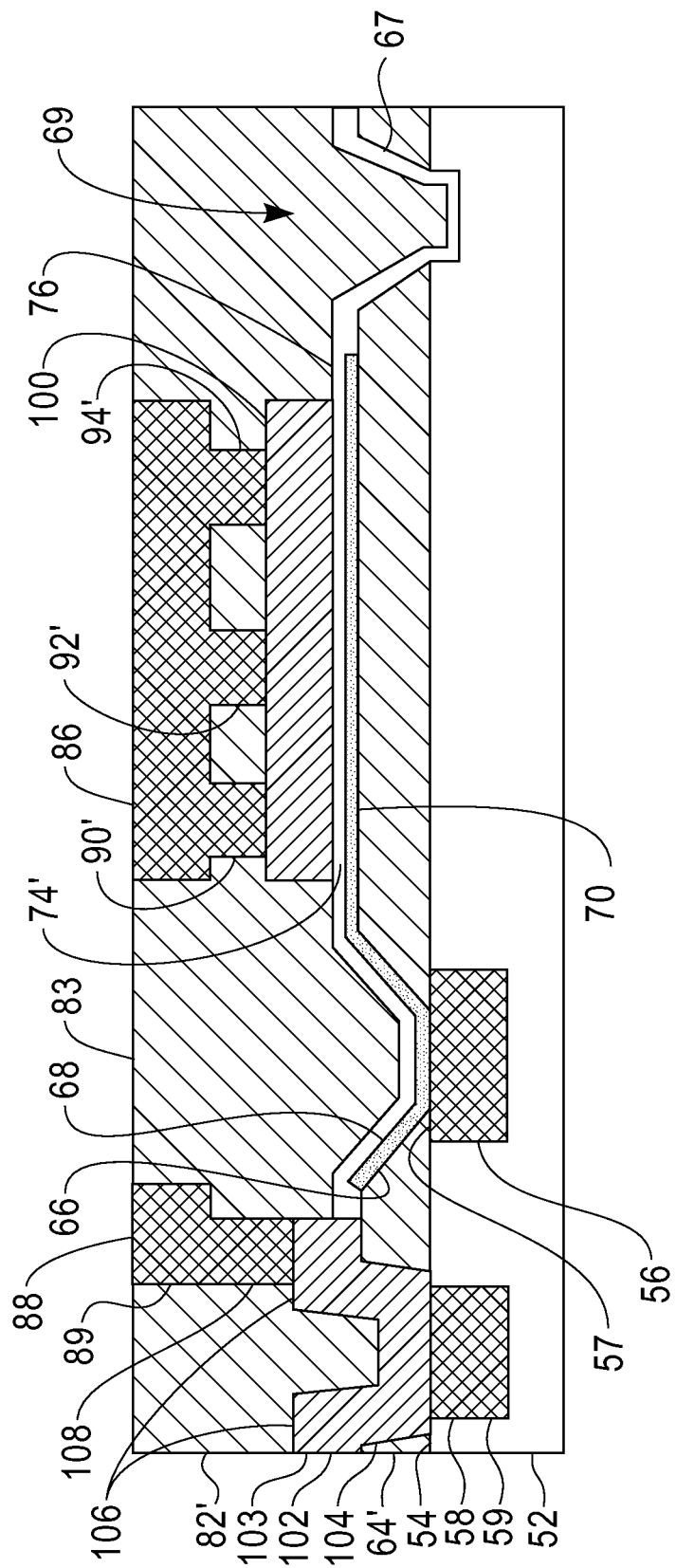
FIG. 3 is a cross-section view of a third embodiment of the invention.

FIG. 3 is a cross-section view of yet another embodiment of the invention. In this embodiment, the lower capacitor plate conductor is not used to form an independent wiring level 103 and the upper capacitor plate conductor is used to form an independent wiring level 103 and the upper capacitor plate conductor is connected using a via to independent wiring level 89 above capacitor 74'. FIG. 3 is similar to FIG. 2 except top electrode 100 of capacitor 74' in FIG. 3 is thicker than top electrode 78 of capacitor 74 in FIG. 2. In FIG. 3, like references are used for similar structure or apparatus shown in FIG. 2. In FIG. 3, lead 102 of a first independent wiring level 103 may be formed at the same time top electrode 100 is formed. Top electrode 100 is patterned to be interior of the periphery of bottom electrode 70 to avoid having a sharp corner or edge of MIM capacitor bottom electrode 70 from shorting due to a high electric field through the MIM capacitor insulating layer 76 to top electrode 100. Lead 102 is patterned to provide a conformal layer in tapered opening 104 in first insulating layer 64'. Lead 102 has an upper surface 106 for electrical connection to via 108. Via 108 passes through a portion of third insulating layer 82' to lead 88 which is in a second independent wiring level 89. Top electrode 100 and lead 102 may have a thickness in the range from 0.1 to 10 µm, more typically in the range from 0.2 to 2 µm, forms independent wiring level 103 and may be formed by the copper damascene process described above or comprise metal layers such as TiN/AlCu/TiN which may be formed by a subtractive etch process described above. Vias 90', 92' and 94' connect top electrode 100 to lead 86. Lead 86 is in second independent wiring level 89.

Figure 4:
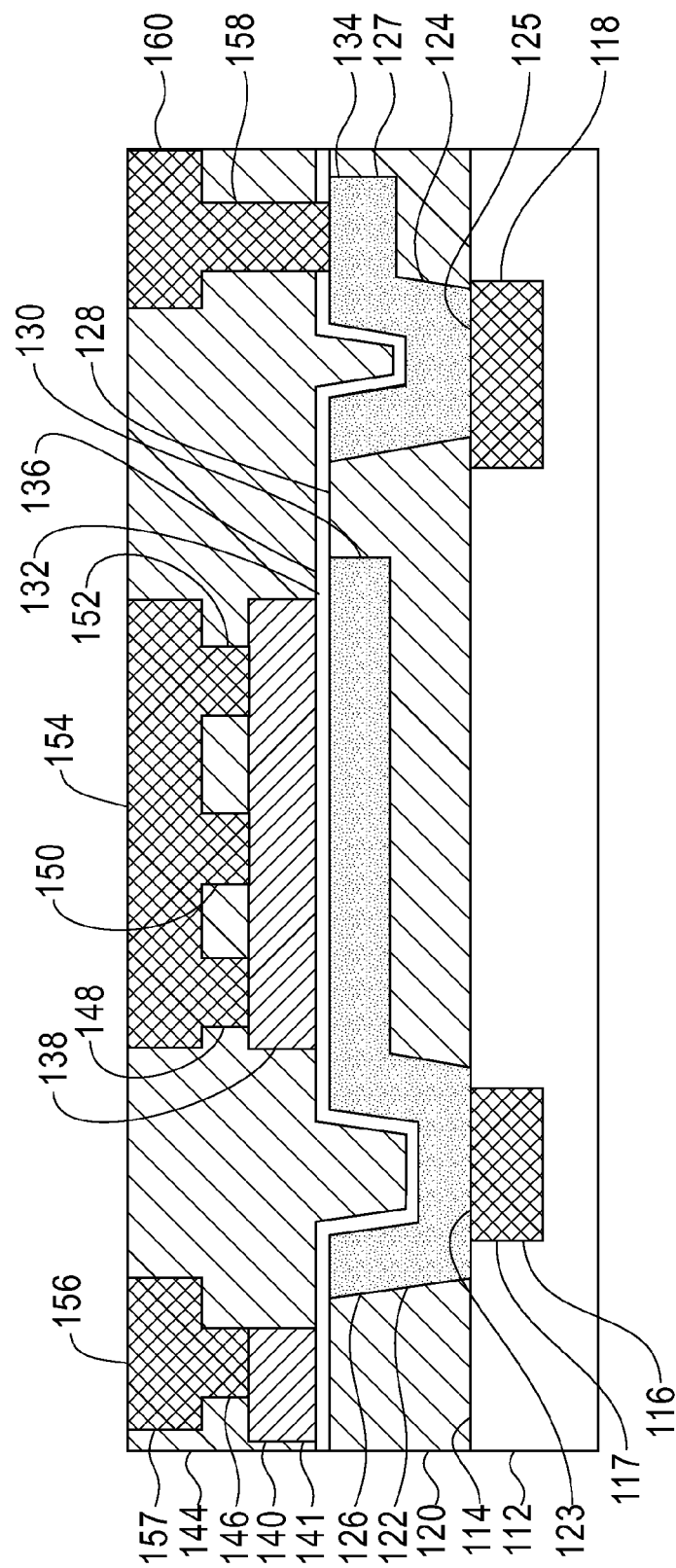
FIG. 4 is a cross-section view of a fourth embodiment of the invention.

FIG. 4 is a cross-section view of yet another embodiment of the invention. In this embodiment, both the lower and upper capacitor plate conductors 130 and 138 are also used to form respective independent wiring levels 127 and 141 and the upper capacitor plate conductor 138 is connected using vias 148, 150 and 152 to fourth conductor 154 of independent wiring level 157 above capacitor 132. In FIG. 4, an insulating substrate 112 having an upper surface 114 and having first and second spaced apart wires 116 and 118 embedded in upper surface 114 of substrate 112 is shown and forms an independent wiring level 117. Wires 116, 118 and independent wiring level 117 may have a thickness in the range from 0.1 to 10 µm, more typically in the range from 0.2 to 2 µm. A first insulating layer 120 is formed over upper surface 114 of insulating substrate 112 and over first and second wires 116 and 118. A first tapered opening 122 is formed in first insulating layer 120 over first wire 116 exposing an upper surface 123 of first wire 116. A second tapered opening 124 is formed in first insulating layer 120 over second wire 118 exposing an upper surface 125 of second wire 118.

A first conductor 126 is formed over first tapered opening 122, and embedded in upper surface 128 of first insulating layer 120 and coupled to bottom electrode 130 of capacitor 132. Bottom electrode 130 is embedded in or below upper surface 128 of first insulating layer 120 such as by a damascene process. A second conductor 134 is formed over second tapered opening 124 and embedded in or below upper surface 128 of first insulating layer 120. First conductor 126, bottom electrode 130 and second conductor 134 are in an independent wiring level 127 and may have a thickness in the range from 0.1 to 10 µm, more typically in the range from 0.2 to 2 µm. A second insulating layer 136 is formed over bottom electrode 130 of capacitor 132. Top electrode 138 of capacitor 132 is formed on second insulating layer 136 and is positioned above bottom electrode 130. Third conductor 140 is formed on second insulating layer 136. Top electrode 138 is formed having a periphery interior of bottom electrode 130. Top electrode 138 and third conductor 140 are in independent wiring level 141 and are typically lithographically patterned from a common blanket layer of metal and may have a thickness in the range from 0.1 to 10 µm, more typically in the range from 0.2 to 2 µm.

A third insulating layer 144 is formed over second insulating layer 136, third conductor 140, and top electrode 138. Via 146 is formed through third insulating layer 144 to third conductor 140. Vias 148, 150 and 152 are formed through third insulating layer 144 to top electrode 138 of capacitor 132. A fourth conductor 154 is formed embedded in third insulating layer 144 over vias 148, 150 and 152 to electrically connect fourth conductor 154 to top electrode 138. A fifth conductor 156 is formed embedded in third insulating layer 144 over via 146 to electrically connect fifth conductor 156 to third conductor 140. Via 158 is formed through third insulating layer 144 to second conductor 134. A sixth conductor 160 is formed embedded in third insulating layer 144 over via 158 to electrically connect sixth conductor 160 to second conductor 134. Fourth conductor 154, fifth conductor 156 and sixth conductor 160 are in an independent wiring level 157 and may have a thickness in the range from 0.1 to 10 µm, more typically in the range from 0.2 to 2 µm. Independent wiring level 157 may be formed by a dual damascene copper process.

Although the embodiments described in FIGS. 2, 3, and 4 employed a dual damascene copper layer over the MIM capacitor, it is also envisioned that a planer tungsten stud via, as known in the art, could be formed with either a damascene copper or subtractive etch wire formed above to connect to the tungsten stud via.

Figure 5:
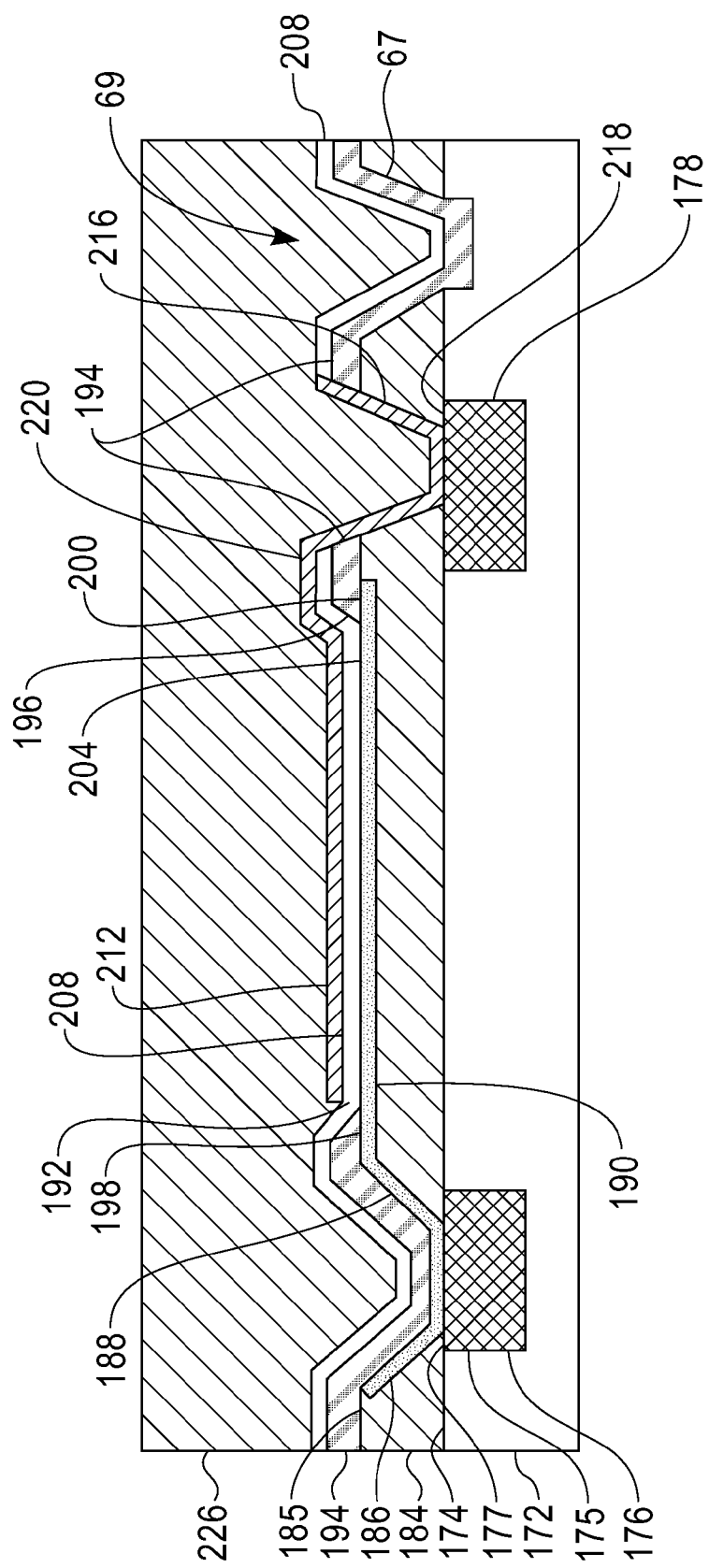
FIG. 5 is a cross-section view of a fifth embodiment of the invention.

FIG. 5 shows a cross section view of still yet another embodiment of the invention. In this embodiment, neither the lower capacitor plate nor upper capacitor plate conductors are used to form independent wiring levels. Both the lower and upper capacitor plate conductors are directly connected using a tapered via to independent wiring level 175 below the capacitor 192. In FIG. 5, an insulating substrate 172 having an upper surface 174 is shown. Insulating substrate 172 contains first and second spaced apart metal leads 176 and 178. In FIG. 5, like references are used for similar structure or apparatus shown in FIG. 2. A first insulating layer 184 is formed on upper surface 174 of insulating substrate 172 and over first and second leads 176 and 178. A first tapered opening 186 is formed in first insulating layer 184 over first metal lead 176 exposing upper surface 177 of first metal lead 176. A first conductor 188 is formed over first tapered opening 186, upper surface 177 of first metal lead 176 and over upper surface 185 of first insulating layer 184 to electrically connect first conductor 188 to bottom electrode 190 of parallel plate capacitor 192 formed on upper surface 185.

First conductor 188 and bottom electrode 190 may be formed at the same time by blanket deposition of a metal and patterned by etching using a mask. First conductor 188 and bottom electrode 190 may have a thickness in the range from 0.1 µm to 5 µm and preferably about 200 nm comprising a 30 nm layer of TiN, a 140 nm layer of AlCu and a 30 nm layer of TiN there over or about 500 nm comprising comprise a 30 nm layer of TiN, a 440 nm layer of AlCu and a 30 nm layer of TiN there over. First conductor 188 and bottom electrode 190 of capacitor 192 may be selected from the group comprising W, TiN, TiN/AlCu/TiN, Ta, TaN/Ta, and combinations thereof.

A cap layer 194 is formed over insulating layer 184, first conductor 188, and bottom electrode 190 and opening 67. Cap layer 194 comprises an insulator such as silicon oxide, silicon nitride, SiCOH or porous SiCOH. An opening 196 is formed in cap layer 194 over bottom electrode 190 and interior of the periphery edges 198 and 200 of bottom electrode 190 to expose upper surface 204 of bottom electrode 190. Cap layer 194 functions to provide an insulator with additional thickness at the periphery of the bottom electrode 190 to reduce the electric field and increase the time dependent dielectric breakdown (TDDB) of the dielectric between top electrode 212 and bottom electrode 190 of capacitor 192. A second insulating layer 208 comprising the main dielectric of capacitor 194 is formed in opening 196, on cap layer 194 and over upper surface 204 of bottom electrode 190. Second insulating layer 208 may have a thickness in the range from 25 nm to 75 nm and preferably about 30 nm to 50 nm and may comprise silicon nitride.

A second tapered opening 216 is formed through cap layer 194 and insulating layer 184 over second lead 178 to expose upper surface 218. A top electrode 212 of capacitor 192 is formed on second insulating layer 208 positioned over bottom electrode 190. Conductor 220 is formed over opening 216 and cap layer 194 to connect second lead 178 to top electrode 212 of capacitor 192. Top electrode 212 and conductor 220 may be formed such as by blanket deposition of a metal and patterned by etching using a mask and may have a thickness in the range from 0.1 µm to 5 µm and preferably about 200 nm comprising a 30 nm layer of TiN, a 140 nm layer of AlCu and a 30 nm layer of TiN there over or about 500 nm comprising a 30 nm layer of TiN, a 440 nm layer of AlCu and a 30 nm layer of TiN there over. Top electrode 212 may have a periphery interior of bottom electrode 190 and may comprise W, TiN, TiN/AlCu/TiN, Ta, TaN/Ta, and combinations thereof.

A third insulating layer 226 is formed over insulating layer 208, top electrode 212 and conductor 220. Third insulating layer 226 may comprise a dielectric selected from the group consisting of silicon dioxide, SiCOH and porous-SiCOH and may have a thickness in the range from 0.5 µm to 5 µm and preferably about 2 µm. As described previously, MIM capacitor 192 is contacted from below to independent wiring level 175.

Figure 6:
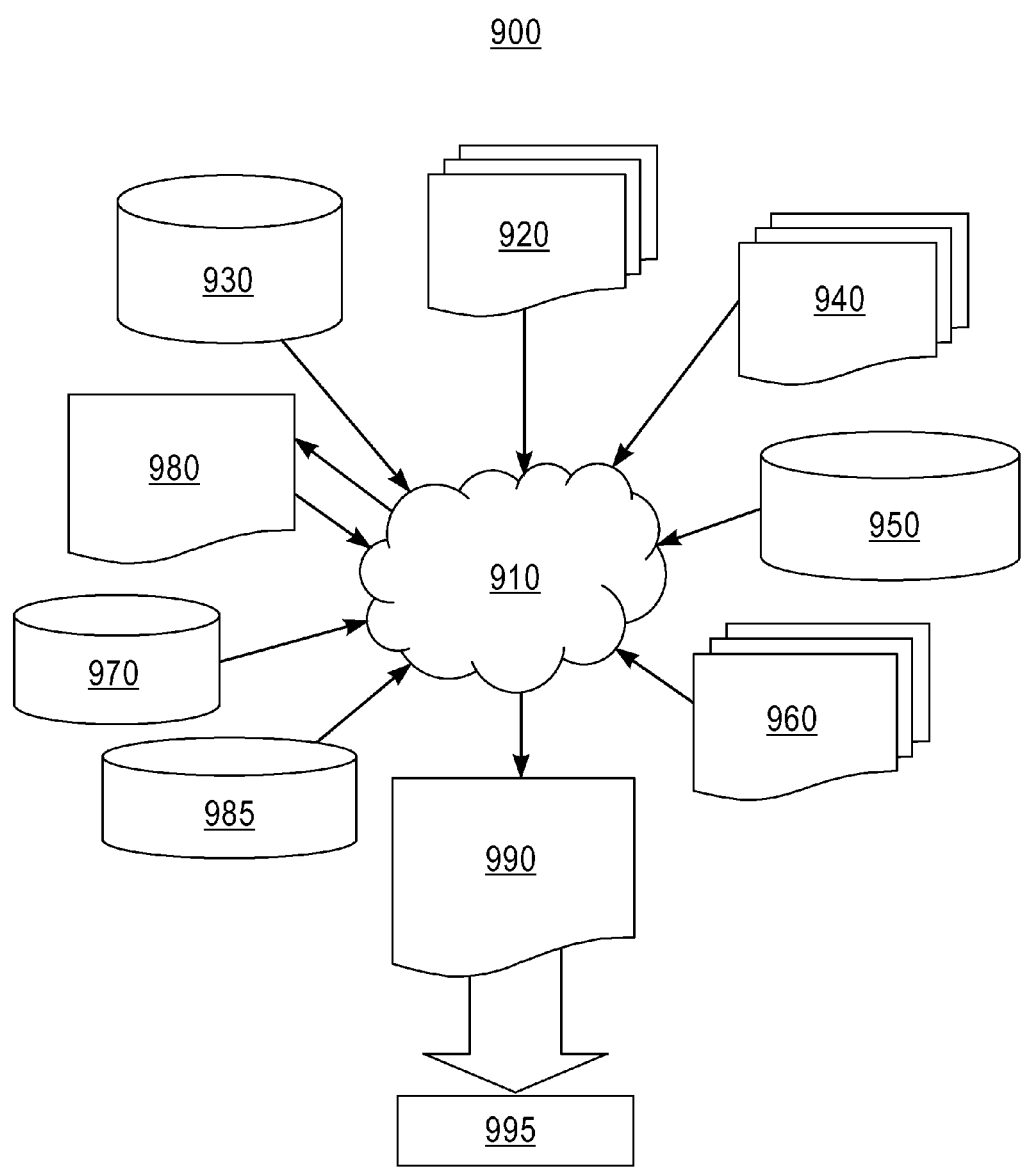
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a component such as a capacitor, inductor, transistor or wiring levels or from a design flow 900 for instantiating the design into a programmable array, for example a programmable gate array (PGA) or a field programmable gate array (FPGA) offered by Altera® Inc. or Xilinx® Inc.

FIG. 6 illustrates a design flow for such design structures including an input design structure 920 that is preferably processed by a design process 910. Input design structure 920 may be a logical simulation design structure generated and processed by design process 910 to produce a logically equivalent functional representation of a hardware device. Input design structure 920 may also or alternatively comprise data and/or program instructions that when processed by design process 910, generate a functional representation of the physical structure of a hardware device. Whether representing functional and/or structural design features, input design structure 920 may be generated using electronic computer-aided design (ECAD) such as implemented by a core developer/designer. When encoded on a machine-readable data transmission, gate array, or storage medium, input design structure 920 may be accessed and processed by one or more hardware and/or software modules within design process 910 to simulate or otherwise functionally represent an electronic component, circuit, electronic or logic module, apparatus, device, or system such as a capacitor, tapered vias, vias and independent wiring levels shown in FIGS. 1-5. As such, input design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a Netlist 980 which may contain design structures such as input design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process input design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

The devices, circuits and processes described herein and shown in FIGS. 1-5 may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., capacitors, inductors, tapered vias, vias, wiring levels, FPGAs) suitable for using in conjunction with the processes described herein are within the scope of the invention.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The devices, circuits and processes described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., capacitors, inductors, tapered vias, vias and wiring levels, FPGAs) suitable for using in conjunction with the processes described herein are within the scope of the invention.

While there has been described and illustrated apparatus, design structures and a method for forming a metal insulator metal capacitor and interconnecting wiring containing tapered vias connecting to other wiring layers, it will be apparent to those skilled in the art that modifications and variations are possible without deviating from the broad scope of the invention which shall be limited solely by the scope of the claims appended hereto.

What is claimed is:

1. An apparatus comprising:
   an insulating substrate having an upper surface and having a first wire in said insulating substrate;
   a first insulating layer over said upper surface of said insulating substrate and over said first wire;
   a first tapered opening in said first insulating layer over said first wire exposing said upper surface of said first wire;
   a bottom electrode of a capacitor on said first insulating layer;
   a first conductor over said upper surface of said first wire, said first tapered opening and said first insulating layer to said bottom electrode;
   a second insulating layer over said bottom electrode; and
   a top electrode of said capacitor on said second insulating layer positioned over said bottom electrode, said top electrode having a periphery interior of a periphery of said bottom electrode.

2. An apparatus comprising:
   an insulating substrate having an upper surface and having a first wire in said insulating substrate;
   a first insulating layer over said upper surface of said insulating substrate and over said first wire;
   a first tapered opening in said first insulating layer over said wire exposing said upper Surface of said first wire;
   a bottom electrode of a capacitor on said first insulating layer;
   a first conductor over said upper surface of said first wire, said first tapered opening and said first insulating layer to said bottom electrode;
   a second insulating layer over said bottom electrode;
   a top electrode of said capacitor on said second insulating layer positioned over said bottom electrode, said top electrode having a periphery interior of a periphery of said bottom electrode;
   a third insulating layer over said second insulating layer and said top electrode;
   a second wire embedded in said third insulating layer over said top electrode; and
   a plurality of vias formed in said third insulating layer extending from said second wire to an upper surface of said top electrode of said capacitor.

3. The apparatus of claim 2 further including:
   a third wire in said third insulating layer over a fourth wire in said insulating substrate spaced apart from said first wire; and
   a via formed in said third insulating layer and said first insulating layer extending from said third wire to said fourth wire.

4. An apparatus of claim 2 further comprising:
   a second opening in said first insulating layer extending to a third wire in said insulating substrate; said third wire spaced apart from said first wire; and
   a second conductor in said second opening on said third wire and on said first insulating layer;
   said third insulating layer over said second conductor and said top electrode;
   said top electrode and said second conductor having a thickness in the range from 0.1 µm to 10 µm.

5. The apparatus of claim 4 further including a fourth wire in said third insulating layer above said second conductor; and
   a via formed in said third insulating layer extending from said fourth wire to said second conductor.

6. An apparatus comprising:
   an insulating substrate having an upper surface and having a first wire in said insulating substrate;
   a first insulating layer over said upper surface of said insulating substrate and over said first wire;
   a first tapered opening in said first insulating layer over said wire exposing said upper surface of said first wire;
   a bottom electrode of a capacitor on said first insulating layer;

a first conductor over said upper surface of said first wire, said first tapered opening and said first insulating layer to said bottom electrode;

a second insulating layer over said bottom electrode;

a top electrode of said capacitor on said second insulating layer positioned over said bottom electrode, said top electrode having a periphery interior of a periphery of said bottom electrode;

said insulating substrate having a second wire in said insulating substrate;

said first and second wires spaced apart having an upper surface substantially coplanar with said upper surface of said insulating substrate;

said first insulating layer over an upper surface of said second wire;

a cap layer formed on at least some edges of said bottom electrode with an insulator which overlaps said edges between said bottom electrode and said first insulating layer;

said second insulating layer over said first insulating layer;

a tapered opening in said first and second insulating layers over said second wire exposing said upper surface of said second wire;

a second conductor layer over said tapered opening and said upper surface of said second wire and coupled to said top electrode; and a third insulating layer over said top electrode and over said second insulating layer.

* * * * *